(12) United States Patent
Hsin et al.

(10) Patent No.: US 7,064,404 B1
(45) Date of Patent: Jun. 20, 2006

(54) IMAGE SENSOR STRUCTURE

(75) Inventors: Chung Hsien Hsin, Hsinchu Hsien (TW); Tony Wang, Hsinchu Hsien (TW); Worrell Tsai, Hsinchu Hsien (TW); Figo Hsieh, Hsinchu Hsien (TW); Wei Chang, Hsinchu Hsien (TW); Jun Jie Yen, Hsinchu Hsien (TW)

(73) Assignee: Kingpak Technology Inc., Hsinchu Hsien (TW)

(*) Notice: Subject to any disclaimer, the term of this patent is extended or adjusted under 35 U.S.C. 154(b) by 110 days.

(21) Appl. No.: 11/052,990

(22) Filed: Feb. 7, 2005

(51) Int. Cl.
*H01L 31/0203* (2006.01)

(52) U.S. Cl. .................. 257/433; 257/434; 257/459
(58) Field of Classification Search ............... None
See application file for complete search history.

(56) References Cited

U.S. PATENT DOCUMENTS 6,384,472 B1 * 5/2002 Huang .................. 257/680
6,849,915 B1 * 2/2005 Tsai ..................... 257/432

* cited by examiner

Primary Examiner—Tu-Tu Ho
(74) Attorney, Agent, or Firm—Pro-Techtor Int'l Services

(57) ABSTRACT

An image sensor structure includes a substrate, four posts, a photosensitive chip, a plurality of wires, a glue layer, and a transparent layer. The substrate has an upper surface on which first electrodes are formed, and a lower surface on which second electrodes are formed. The four posts are arranged on the four angle of the upper surface of the substrate individually. The photosensitive chip is mounted on the upper surface of the substrate. The plurality of wires are electrically connected the photosensitive chip to the first electrodes of the substrate. The glue layer is surrounded to the periphery of the upper surface of the substrate for surrounding the photosensitive chip, and covered the part of the wires. The transparent layer is arranged onto the four posts and the glue layer to cover the photosensitive chip.

4 Claims, 2 Drawing Sheets

IMAGE SENSOR STRUCTURE

BACKGROUND OF THE INVENTION

1. Field of the Invention

The invention relates to an image sensor structure, and in particular to an image sensor structure is capable of manufacturing to be light, thin, and small.

2. Description of the Related Art

Referring to FIG. 1, it is a conventional image sensor structure includes a substrate 10, a frame layer 18, a photosensitive chip 26, a plurality of wires 28, and a transparent layer 34.

The substrate 10 has a first surface 12 on which plurality of first electrodes 15 are formed, and a second surface 14 on which plurality of second electrodes 16 are formed. The first electrodes 15 are corresponding to electrically connect to the second electrodes 16 by the conductive wires 17, which are located at the side of the substrate. The frame layer 18 has an upper surface 20 and a lower surface 22 adhered to the first surface 12 of the substrate 10 to form a chamber 24 together with the substrate 10. The photosensitive chip 26 is arranged within the chamber 24, and is mounted to the first surface 12 of the substrate 10. Each wire 28 has a first terminal 30 and a second terminal 32. The first terminals 30 are electrically connected to the photosensitive chip 26, and the second terminals 32 are electrically connected to the first electrodes 15 of the substrate 10. The transparent layer 34 is adhered to the upper surface 20 of the frame layer 18.

Accordingly, when the photosensitive chip 20 has a large scale, it is inconvenient, or even impossible, in the manufacturing processes for bonding and electrically connecting wires to the first electrodes 16 of the substrate 10. Therefore, the size of the substrate 10 has to be enlarge so as to increase the space for wire bonding.

SUMMARY OF THE INVENTION

An objective of the invention is to provide an image sensor structure, that is ease to be package and capable of reducing the volume of the structure and the manufacturing cost.

Another objective of the invention is to provide an image sensor structure capable of packaging image sensor chip having different sizes without changing the package volume. The objective of the producing packages having the same volume can be achieved.

To achieve the above-mentioned object, the invention provides an image sensor structure includes a substrate, four posts, a photosensitive chip, a plurality of wires, a glue layer, and a transparent layer. The substrate has an upper surface on which first electrodes are formed, and a lower surface on which second electrodes are formed. The four posts are arranged on the four angle of the upper surface of the substrate individually. The photosensitive chip is mounted on the upper surface of the substrate. The plurality of wires are electrically connected the photosensitive chip to the first electrodes of the substrate. The glue layer is surrounded to the periphery of the upper surface of the substrate for surrounding the photosensitive chip, and covered the part of the wires. The transparent layer is arranged onto the four posts and the glue layer to cover the photosensitive chip.

DETAILED DESCRIPTION OF THE INVENTION

Figure 1:
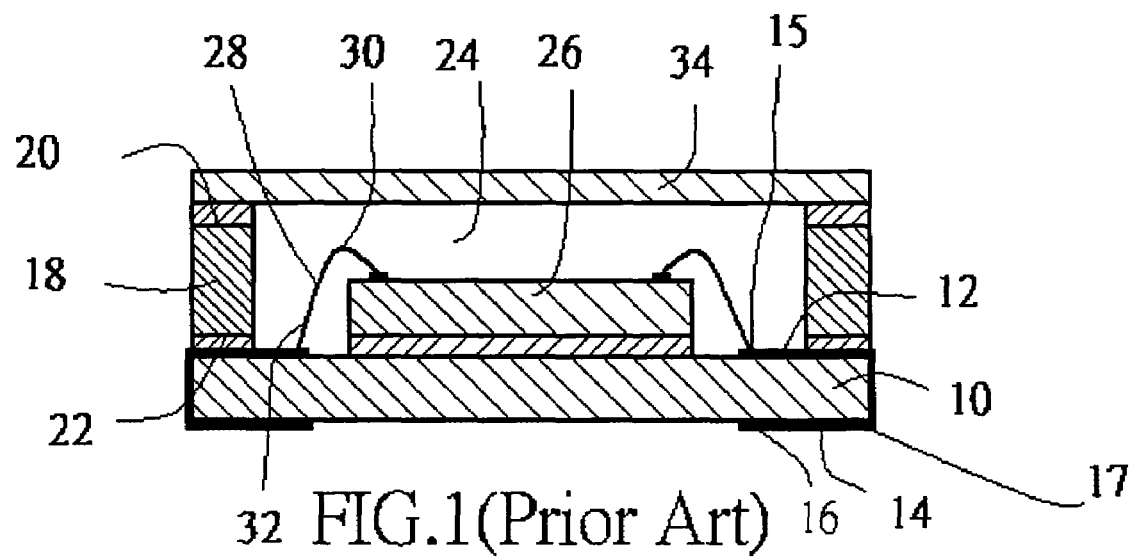
FIG. 1 is a cross-sectional view showing a conventional image sensor structure.
Figure 2:
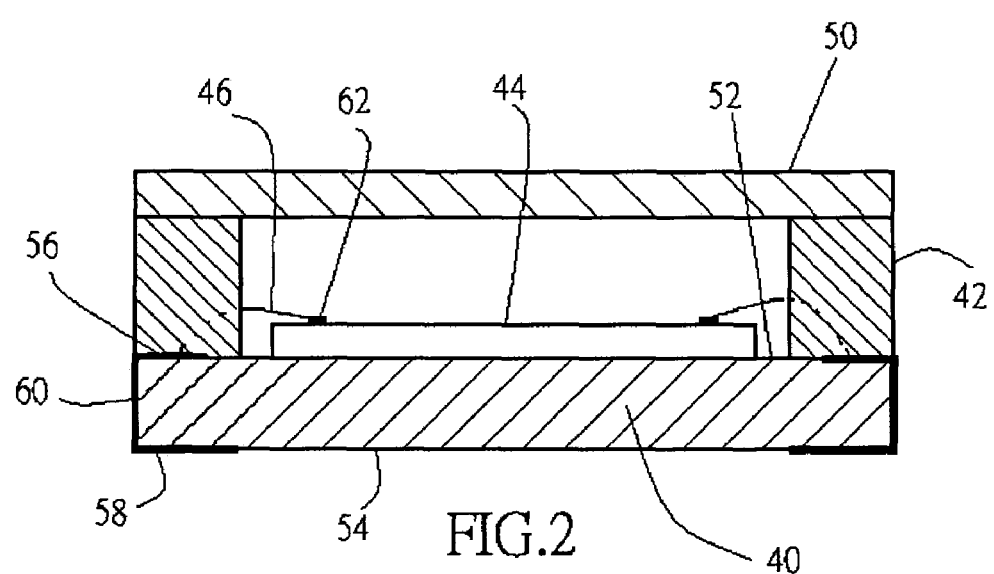
FIG. 2 is a cross-sectional view showing an image sensor structure of the present invention.

Please refer to FIG. 2, it is an image sensor structure of the present invention includes a substrate 40, four posts 42, a photosensitive chip 44, a plurality of wires 46, a glue layer 48, and a transparent layer 50.

Figure 3:
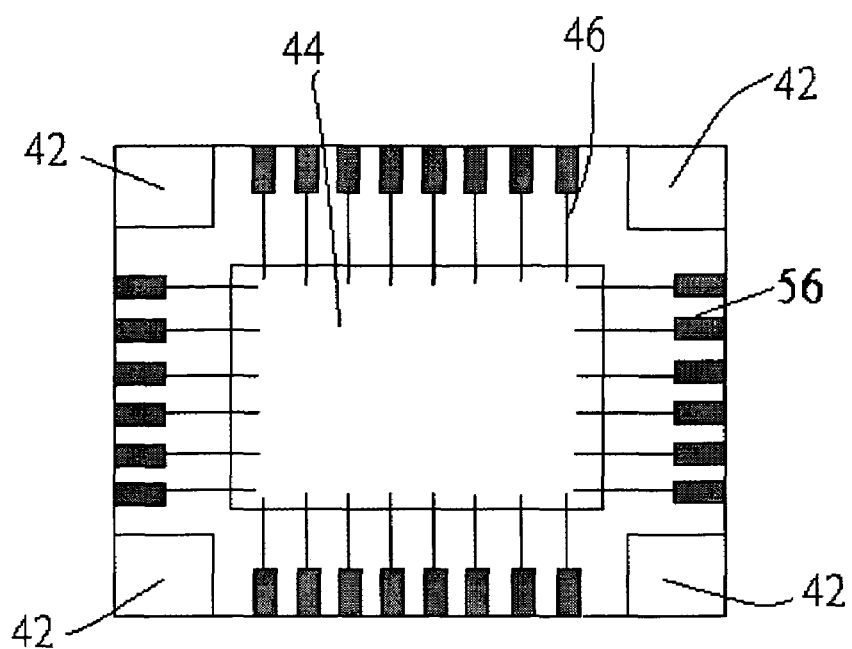
FIG. 3 is a first cross-section view showing an image sensor structure without glue layer.
Figure 4:
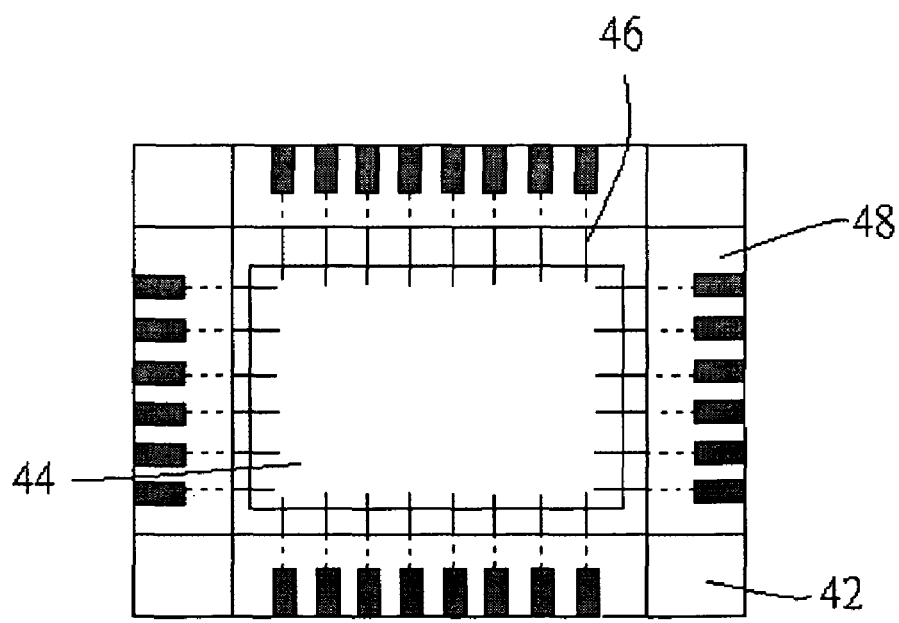
FIG. 4 is a second cross-section view showing an image sensor structure with glue layer.

Please refer to FIG. 3 and FIG. 4. The substrate 40 has an upper surface 52 on which first electrodes 56 are formed, and a lower surface 54 on which second electrodes 58 are formed. Conductive elements 60 are formed on the periphery of the substrate 40 for electrically connecting the first electrodes 56 to corresponding to the second electrodes 58 of the substrate 40.

The four posts 42 are arranged on the four angle of the upper surface 52 of the substrate 40 individually.

The photosensitive chip 44 is mounted on the upper surface 52 of the substrate 40, a plurality of pads 62 are formed on the photosensitive chip 44.

The plurality of wires 46 are electrically connected the pads 62 of the photosensitive chip 44 to the first electrodes 56 of the substrate 40.

The glue layer 48 is surrounded to the periphery of the upper surface 52 of the substrate 40 for surrounding the photosensitive chip 44, and covered the part of the wires 46.

The transparent layer 50 is arranged onto the four posts 42 to cover the photosensitive chip 44.

Therefore, it is possible to select the substrate 50 having a smaller size to package the photosensitive chip 44 having the same original size. Thus, it is possible to obtain an image sensor structure having smaller volume and to decrease the material costs for the substrate 40.

While the invention has been described by way of an example and in terms of a preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

What is claimed is:

1. An image sensor structure, the structure comprising:
    a substrate having an upper surface on which first electrodes are formed, and a lower surface on which second electrodes are formed;
    four posts arranged on the four angle of the upper surface of the substrate individually;
    a photosensitive chip mounted on the upper surface of the substrate;
    a plurality of wires electrically connected the photosensitive chip to the first electrodes of the substrate;
    a glue layer surrounded on the periphery of the upper surface of the substrate for surrounding the photosensitive chip, and covered the part of the wires; and
    a transparent layer arranged onto the four posts and the glue layer to cover the photosensitive chip.

2. The image sensor structure according to claim 1, wherein the periphery of the substrate is formed with conductive material for electrically connecting the first electrodes to corresponding to the second electrodes of the substrate.

3. The image sensor structure according to claim 2, wherein the transparent layer is transparent glass.

4. The image sensor structure according to claim 1, wherein the transparent layer is adhered to the four posts by the glue layer.

* * * * *